United States Patent
Abramovici et al.

(10) Patent No.: US 6,292,916 B1
(45) Date of Patent: Sep. 18, 2001

(54) PARALLEL BACKTRACING FOR SATISFIABILITY ON RECONFIGURABLE HARDWARE

(75) Inventors: Miron Abramovici, Berkeley Heights; Jose T. De Sousa, Sterling Morris County, both of NJ (US); Daniel G. Saab, University Heights, OH (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/209,405
(22) Filed: Dec. 10, 1998
(51) Int. Cl.[7] .............................. G01R 31/28; G06F 11/00
(52) U.S. Cl. ............................................ 714/736; 724/741
(58) Field of Search .............................. 703/27; 714/738; 716/5

(56) References Cited

U.S. PATENT DOCUMENTS

| | | |
|---|---|---|
| 4,541,071 | 9/1985 | Ohmori . |
| 4,672,307 * | 6/1987 | Breuer et al. ........................ 714/738 |
| 5,493,239 | 2/1996 | Zlotnick . |
| 5,572,148 | 11/1996 | Lytle et al. . |
| 5,831,996 * | 11/1998 | Abramovici et al. ................. 371/27 |
| 6,026,222 * | 2/2000 | Gupta et al. ..................... 395/500.06 |
| 6,038,392 * | 3/2000 | Ashar et al. .................... 395/500.48 |
| 6,086,626 * | 6/2000 | Jain et al. ................................ 716/5 |
| 6,131,181 * | 10/2000 | Bushnell et al. ......................... 716/4 |

FOREIGN PATENT DOCUMENTS

| | | |
|---|---|---|
| 0 759 662 A2 | 2/1997 | (EP) . |
| 2 286 737 A | 8/1995 | (GB) . |
| 2 304 438 A | 3/1997 | (GB) . |

OTHER PUBLICATIONS

Abramovici, Miron; "Satisfiability on Reconfigurable Hardware," Proceedings International Workshop on Field Programmable Logic and Applications, pp. 448–456, Sep. 1997.*

Zhong, Peixin; "Solving Boolean Satisfiability with Dynamic Hardware Configuration", Proceedings International Workshop on Field Programmable Logic and Applications, pp. 326–335, 1998.*

Platzner, Marco "Acceleration of Satisfiability Algorithms by Reconfigurable Hardware", Proceedings International Workshop on Field Programmable Logic and Applications, pp. 69–78, Sep. 1998.*

(List continued on next page.)

*Primary Examiner*—Albert DeCady
*Assistant Examiner*—Joseph D. Torres
(74) *Attorney, Agent, or Firm*—Ryan, Mason & Lewis, LLP

(57) ABSTRACT

The invention provides methods and apparatus for implementing a satisfiability algorithm on reconfigurable hardware. An illustrative embodiment is in the form of a parallel-backtrace satisfier which includes clause logic, literal logic and variable logic for implementing logic functions associated with clauses, literals and variables, respectively, of a circuit to be analyzed. The satisfier also includes a controller, e.g., a synchronization unit, for directing the operation of the clause logic, literal logic and variable logic so as to provide parallel backtracing of objectives along a plurality of circuit paths from a primary output of the circuit toward its primary inputs. Enhanced parallelism is implemented in the illustrative embodiment not only by providing the parallel backtracing of the multiple objectives, but also by, e.g., providing concurrent assignments of multiple primary inputs. The clause logic, literal logic and variable logic may each be implemented using easily-scalable iterative logic array (ILA) structures including multiple cells, with each cell representative of a logic function associated with the processing of a corresponding clause, literal or variable of the circuit to be analyzed.

27 Claims, 4 Drawing Sheets

OTHER PUBLICATIONS

Rashid, Azra; "Dynamic Circuit Generation for Solving Specific problem Instances of Boolean Satisfiability", Proceedings IEEE Symposium on Field Programmable Custom Computing Machines, pp. 196–203, Apr. 1998.*

Zhong, P.; "Accelerating Boolean Satisfiability with Configurable Hardware", Proceedings IEEE Symposium on Field Programmable Custom Computing Machines, Apr. 1998.*

Silva, Joao; "GRASP—a new search algorithm for satisfiability", Proceedigns of the 1996 IEEE/ACM International Conference on Computer–Aided Design, pp. 220–227.*

P. Zhong et al., "Accelerating Boolean Satisfiability with Configurable Hardware,"Proc. IEEE Symp. on Field–Programmable Custom Computing Machines, Apr. 1998.

P. Zhong et al., "Using Reconfigurable Computing Techniques to Accelerate Problems in CAD Domain: A Case Study with Boolean Satisfiability," Proc. Design Automation Conf., Jun. 1998.

A. Rashid et al., "Dynamic Circuit Generation for Solving Specific Problem Instances of Boolean Satisfiability," Proc. IEEE Symp. on Field–Programmable Custom Computing Machines, pp. 196–203, Apr. 1998.

H. Fujiwara et al., "On the Acceleration of Test Generation Algorithms," IEEE Trans. on Computers, vol. C–32, No. 12, pp. 1137–1144, Dec. 1983.

M. Platzner et al., "Acceleration of Satisfiability algorithms by Reconfigurable Hardware, " Proc. Intn'l. Workshop of Field–Programmable Logic and Applications, pp.69–78, Sep. 1998.

M. Abramovici et al., "Satisfiability on Reconfigurable Hardware," Proc. Intn'l. Workshop of Field–Programmable Logic and Applications, pp. 448–456, Sep. 1997.

P. Zhong et al., "Solving Boolean Satisfiability with Dynamic Hardware Configurations," Proc. Intn'l. Workshop on Field–Programmable Logic and Applications, pp. 326–335, 1998.

J.H. Mayer, "Reconfigurable computing redefines design flexibility," Computer Design, pp. 49–52, Feb. 1997.

J. Rosenberg, "Implementing Cache Logic™ with FPGAs," Atmel Application Note 0461A, pp. 7–11 to 7–14, 1994.

B.K. Fawcett, "Applications of Reconfigurable Logic", in "More FPGAs," W.R. Moore and W. Luk, eds., Abingdon EE & CS Books, Oxford, England, pp. 57–69, 1994.

H. Schmit, "Incremental Reconfiguration for Pipelined Applications," IEEE Symposium on FPGAs for Custom Computing Machines, pp. 47–55, 1996.

"Atmel FPGA is as Versatile as Madison Square Garden, "ASIC Design, p. A21, Dec. 1994.

M. Disman, "FPGAs go on the record," OEM Magazine, pp. 85, 87, Nov. 1996.

K. Kwiat and W. Debany, "Reconfigurable Logic Modeling," Design Automation, http://www.isdmag.com/Editorial/1996/CoverStory9612.html, 5 pages, Dec. 1996.

M.J. Wirthlin and B.L. Hutchings, "A Dynamic Instruction Set Computer," Proceedings of the IEEE Symposium on FPGAs for Custom Computing Machines, Apr. 19–21, 1995, Napa Valley, CA, pp. 99–107, Apr. 1995.

T.J. Park et al., "Partitioning Methods for Satisfiability Testing on Large Formulas," Proc. 13th Intn'l. Conf. on Automated Deduction, 7 pages, 1996.

* cited by examiner

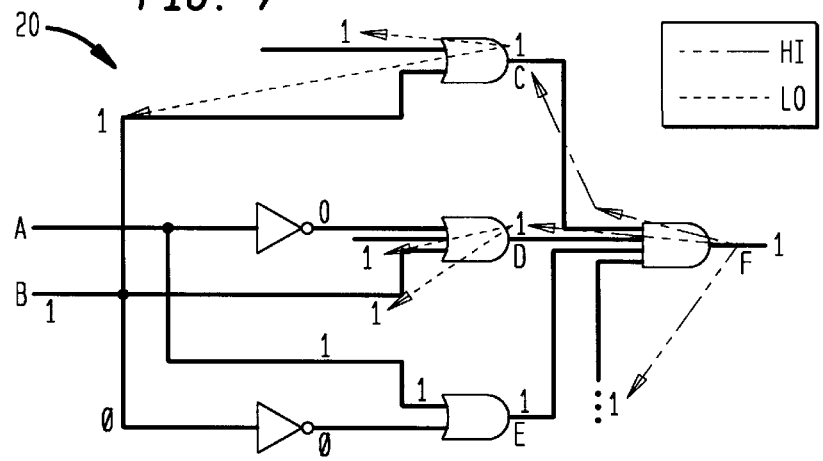
FIG. 7
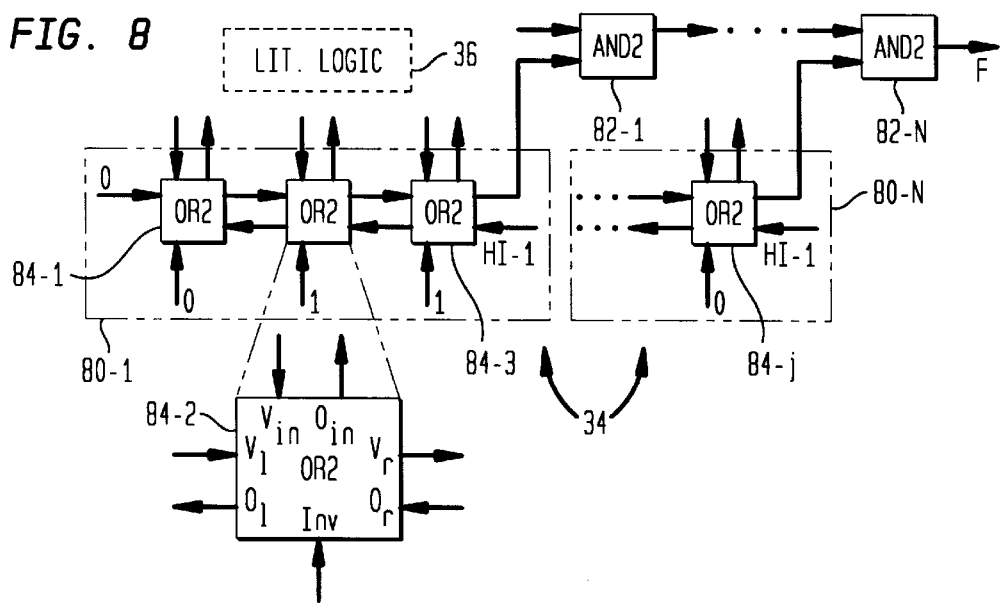
FIG. 8
FIG. 9
| $O_r$ | $V_l$ | $V_{in}$ | $O_l$ | $O_{in}$ |
|---|---|---|---|---|
| 0 | - | - | 0 | 0 |
| - | 1 | - | 0 | 0 |
| - | - | 1 | 0 | 0 |
| | 0 | 0 | | |
| H/L | x | x | LO | LO |
| H/L | x | 0 | H/L | 0 |
| H/L | 0 | x | 0 | H/L |

FIG. 10
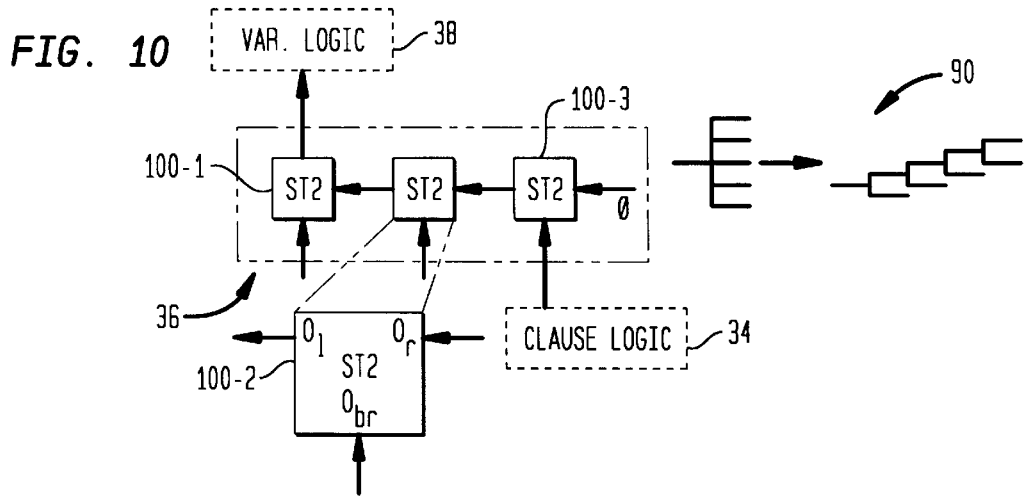
FIG. 11
| $O_r$ | $O_{br}$ | $O_l$ | NOTES |
|---|---|---|---|
| 0 | 0 | 0 | SAME OBJECTIVES |
| H/L-v | H/L-v | H/L-v | |
| - | HI-v | HI-v | HI OVERRIDES ANY OBJECTIVE |
| HI-v | LO-a | | |
| 0 | H/L-v | H/L-v | ANY OBJECTIVE OVERRIDES 0 |
| H/L/*-v | 0 | H/L/*-v | |
| LO-v̄ | LO-v | *-v | POTENTIAL CONFLICT GENERATED |
| *-v | LO-a | | * OVERRIDES LO |
FIG. 12
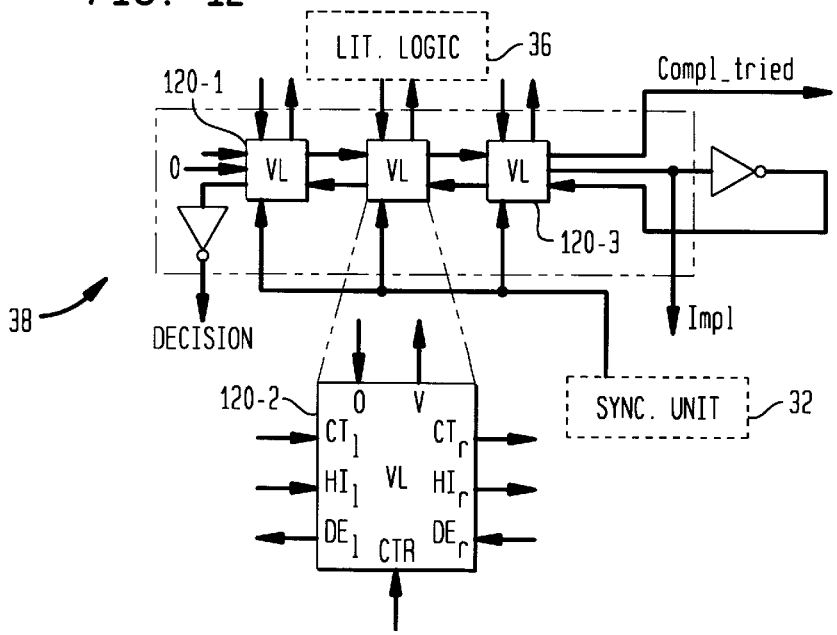

PARALLEL BACKTRACING FOR SATISFIABILITY ON RECONFIGURABLE HARDWARE

FIELD OF THE INVENTION

The present invention relates generally to computational aspects of the design and testing of integrated circuits and other complex devices and systems, and more particularly to techniques for implementing so-called satisfiability algorithms involving such devices and systems.

BACKGROUND OF THE INVENTION

Satisfiability (SAT) is a computationally-difficult problem which is central to many computer-aided design (CAD) and test applications. The SAT problem may be characterized as follows: given a boolean function $F(x_1, x_2, \ldots x_n)$, find an assignment of binary values to the variables $x_1, x_2, \ldots x_n$, such that F is set to 1, or prove that no such assignment exists. Typically, F is expressed as a product-of-sums, which is also called conjunctive normal form (CNF). In applications involving combinational circuits, the variables $x_j$ may represent primary inputs (PIs) of a given circuit, while F represents the primary output (PO) of that circuit. CAD and test applications that can be characterized as a SAT problem include, for example, timing verification, routing and routability analysis, fault diagnosis, logic synthesis and logic verification. SAT is also related to automatic test pattern generation (ATPG) algorithms, as it can be viewed, e.g., as the problem of generating a test for a stuck-at-0 fault on a PO. An important component in ATPG is the so-called line justification problem, which deals with setting an internal signal to a given value, and corresponds to SAT on a subcircuit. Many other computationally-difficult problems, such as graph coloring, scheduling, theorem proving and constraint satisfaction problems, have also been mapped to SAT problems.

A significant drawback often associated with SAT problems is the amount of computation time required for their solution. Even with the most advanced SAT algorithms, difficult problems, such as, for example, those involving complex very-large-scale integration (VLSI) circuits, can require many hours of computation using powerfill computers. A number of recently-developed techniques have attempted to simplify the SAT computation process through the use of reconfigurable hardware. Reconfigurable hardware is used in adaptive computing and other applications to implement logic circuit functions. A given set of reconfigurable hardware, which may be based on field programmable gate arrays (FPGAS) or other similar programmable logic devices, can be reconfigured so as to provide different logic functions at different times, thereby in effect providing the functionality of a complex circuit which would otherwise require substantially more hardware. Circuits implemented in reconfigurable hardware to facilitate SAT computation are referred to as "satisfiers." Although existing satisfiers and other conventional techniques and devices have produced reductions in the computational complexity of SAT algorithms, additional improvements are needed to provide further improvements in the efficiency of the many CAD, test and other types of applications that utilize SAT.

SUMMARY OF THE INVENTION

The invention provides methods and apparatus for implementing a satisfiability algorithm on reconfigurable hardware. An illustrative embodiment of the invention is a parallel-backtrace satisfier which includes a controller, e.g., a synchronization unit, which directs the operation of clause logic, literal logic and variable logic for implementing logic functions associated with the processing of clauses, literals and variables, respectively, of a circuit to be analyzed. In the illustrative embodiment, enhanced parallelism is implemented using parallel backtracing of multiple objectives along multiple circuit paths from a primary output of the circuit toward its primary inputs. Further parallelism may be provided by, for example, providing concurrent assignments of several primary inputs. The clause logic, literal logic and variable logic may each be implemented using easily-scalable iterative logic array (ILA) structures which are made up of multiple cells, with each cell representative of a logic function associated with the processing of a corresponding clause, literal or variable of the circuit.

Compared to conventional SAT algorithms implemented in software, a parallel-backtrace satisfier with prioritized objectives and concurrent assignments significantly reduces the amount of search time required to solve the SAT problem, resulting in a computational speedup which may be as much as several orders of magnitude in certain applications. The invention also provides similar advantages relative to previous satisfiers implemented in reconfigurable hardware. Unlike previous satisfiers whose efficiency is limited by incorrect or unnecessary variable assignments, parallel-backtrace satisfiers in accordance with the invention can skip over variables whose assignment is unnecessary in the current state and select only the correct values for variables which become dynamically unate in the current state, i.e., have all their literals either complemented or not complemented in the current state.

BRIEF DESCRIPTION OF THE DRAWINGS

FIGS. 4, 5, 6 and 7 illustrate exemplary backtracing operations in accordance with the invention;

FIG. 8 shows the clause logic of the FIG. 3 satisfier in greater detail;

FIG. 9 illustrates objective priority computation in the clause logic of FIG. 8;

FIG. 10 shows the literal logic of the FIG. 3 satisfier in greater detail;

FIG. 11 illustrates objective computation in the literal logic of FIG. 10; and

FIG. 12 shows the variable logic of the FIG. 3 satisfier in greater detail.

DETAILED DESCRIPTION OF THE INVENTION

The following description will illustrate the present invention using an exemplary system which includes a set of reconfigurable hardware and is suitable for processing complex logic circuits. It should be understood, however, that the invention is not limited to use with any particular type of system. For example, the described techniques are readily applicable to reconfigurable hardware applications based on various arrangements of single or multiple FPGAs, as well as to reconfigurable hardware which does not include FPGAs. The term "controller" refers to a synchronization unit or other processing device which may be configured to implement at least a portion of a satisfiability algorithm. The term "reconfigurable hardware" as used herein is intended to include any type of system or device capable of implementing a number of different circuit functions, including, for example, single or multiple FPGA devices. Reconfigurable hardware may be implemented in many different ways, including, for example, in the form of a co-processor circuit board attached to a host computer over a bus, as a stand-alone computer, or as any other suitable processing device capable of providing the described functions.

Figure 1:
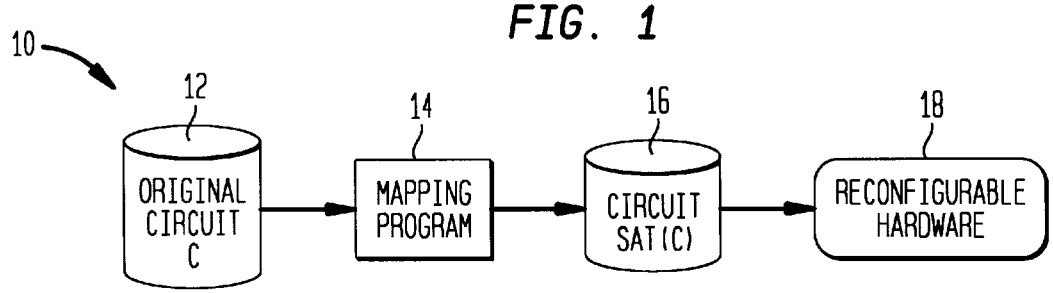
FIG. 1 shows an exemplary satisfiability system in which the invention may be implemented.

FIG. 1 illustrates an exemplary system 10 which uses reconfigurable hardware to facilitate SAT computation, and in which the invention may be implemented. System 10 is of the type described in, e.g., M. Abramovici and P. Menon, "Fault Simulation on Reconfigurable Hardware," Proc. IEEE Symposium on Field-Programmable Custom Computing Machines, April 1997, which is incorporated by reference herein. The system 10 includes storage elements 12, 16, a mapping program 14 and a set of reconfigurable hardware 18. The system 10 is designed to speed up an algorithm SAT working on given circuit C. A description of the original circuit C as stored in 12 is processed by the mapping program 14 to generate the model of a new circuit SAT(C), stored in 16, which executes the algorithm SAT for the circuit C. Since SAT(C) will often be used only once, it would not be economically feasible to implement it in a conventional way, e.g., in an actual circuit. The reconfigurable hardware 18 is therefore used to "virtually" create the SAT(C) circuit. The SAT algorithm SAT is then executed by emulating the SAT(C) circuit in the reconfigurable hardware 18. This allows SAT to run at emulation speed, without incurring the cost of building hardware accelerators or other special-purpose hardware. A circuit such as the SAT(C) circuit created in reconfigurable hardware 18 is referred to as a "satisfier."

Figure 2:
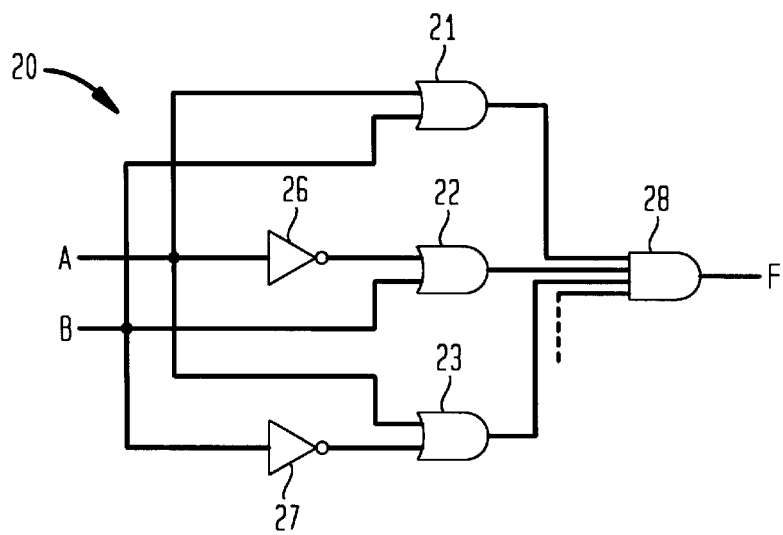
FIG. 2 shows an exemplary conjunctive normal form (CNF) model which may be used in conjunction with the invention.

FIG. 2 illustrates a conjunctive normal form (CNF) model which will be used to illustrate the operation of the invention. In accordance with this model, a CNF for an exemplary formula $$F = (A+B) \wedge (\overline{A}+B) \wedge (A+\overline{B}) \tag{1}$$

is modeled as a two-level circuit 20 including OR gates 21, 22 and 23, inverters 26 and 27, and an AND gate 28. Each primary input (PI) A and B represents a variable, each OR gate input represents a literal, and each OR gate output represents a clause. Satisfiability in this model may be treated as a line justification problem to set the primary output (PO) F to 1. It should be understood that the circuit 20 is a simple example used to illustrate the invention, and that the invention will generally be applied to substantially more complex circuit models. The term "clause" refers generally to an OR gate or its output. The term "stem" refers generally to a primary input from which two or more branches are generated. The term "variable" refers generally to a circuit input, e.g., a primary input, which is assigned a value during processing associated with a satisfiability algorithm.

The present invention provides a massively-parallel fine grain satisfier architecture which in an illustrative embodiment implements concurrent parallel backtracing of all objectives along all possible paths and concurrent assignment of several variables. Another aspect of the invention relates to identification of so-called dynamically unate variables. A unate variable has all its literals either complemented or not complemented, and hence it can never cause a conflict. The literals of a unate variable are known as "pure literals." In the illustrative embodiment of the invention, after a variable is assigned, certain clauses become satisfied. All the unassigned literals of an already-satisfied clause are said to be "dead," because in the current state, their values can no longer influence the satisfied clause.

When a satisfier in accordance with the invention detects that all inverting literals of a variable A have died, it immediately assigns A=1, because this will satisfy all the clauses containing A without causing any conflicts. In other words, although A is not unate, A can be treated as a variable that becomes unate in the current state, i.e., a dynamically unate variable. Similarly, detecting that all non-inverting literals of A have died shows that A may be safely set to 0. Identifying and assigning dynamically unate variables represents an opportunistic assignment which may be treated like a new type of implication. Increasing the number of implications reduces the search space and results in a significant speed-up in solution of the SAT problem. When all the literals of an unassigned variable A have died, e.g., because all the clauses containing A are satisfied, A is said to be a dead variable, which is similar to the "don't cares" described in M. Platzner and G. De Micheli, "Acceleration of Satisfiability Algorithms by Reconfigurable Hardware," Proc. Int'l Workshop on Field-Programmable Logic and Applications, September 1998. A satisfier in accordance with the invention can identify dead variables and never assign them, thus avoiding unnecessary decisions.

Figure 3:
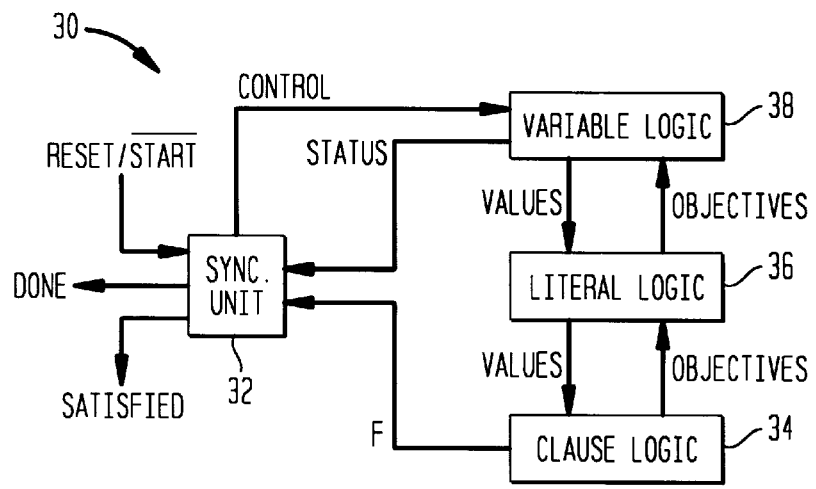
FIG. 3 shows an illustrative embodiment of a parallel-backtrace satisfier in accordance with the invention, including clause logic, literal logic and variable logic.

FIG. 3 shows an exemplary parallel-backtrace satisfier 30 which includes a synchronization unit 32, clause logic 34, literal logic 36 and variable logic 38. The satisfier 30 may be implemented, for example, using a reconfigurable processor board which includes FPGAs designed to support reconfigurable computing applications, or using other suitable arrangements of reconfigurable hardware. The satisfier 30 of FIG. 3 implements a fine-grain line justification algorithm to solve a SAT problem. Central to this algorithm is the concept of "objective," which is a desired assignment l=v of value v to line l, which currently has an unknown value x. An objective may be achieved only by PI assignments. A backtrace procedure propagates an objective l=v along a signal path from l to a PI i, where all the lines along the path have a value x, and determines a PI assignment $i=v_i$ that is likely to contribute to achieving the objective l=v.

In the satisfier 30, the variable logic 38 maintains the current values (0, 1 or x) of the PIs. The variable values are sent to the literal logic 36, which distributes them as literal values to the clause logic 34. The clause logic 34 computes the value of every clause and of the output function F, and also determines objectives for all of the literals. These objectives are sent back to the literal logic 36, which merges objectives arriving on different branches of the same stem into one objective for its corresponding PI. Both the clause logic 34 and literal logic 36 in this embodiment are combinational blocks. The variable logic 38 maps the objectives arriving from the literal logic 36 into PI assignments, e.g., implications or decisions. The synchronization unit 32 initiates backtracing when the function F becomes 0, performs timing, control and status functions, and provides an interface with external circuitry. The Reset/Start signal applied to the synchronization unit 32 initiates the execution, the Done signal indicates completion of the execution, and the Satisfied signal indicates whether the SAT problem has been successfully solved. FIGS. 4 through 7 illustrate several different operations implemented by the satisfier 30 of FIG. 3.

Figure 4:
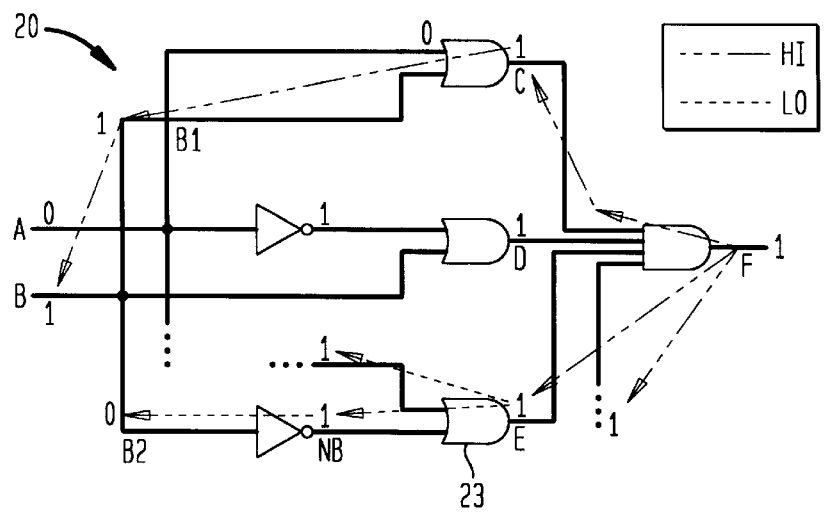

The main objective in the satisfier 30 of FIG. 3 as applied to the circuit model of FIG. 2 is setting F=1. This implies that all the inputs of the AND gate 28 in circuit 20 must be 1. While previous software SAT solvers generally process such simultaneous requirements one objective at a time, the present invention allows all the objectives to be concurrently processed. Allowing concurrent objective propagation along several paths means that several objectives may reach the same fanout stem, each one arriving from a different fanout branch. Since these objectives may be conflicting, a determination should be made as to whether all of the objectives are equally important. FIG. 4 illustrates this determination for the circuit 20. It is assumed in FIG. 4 that A has already been assigned value 0, which in turn satisfied clause D. Note that only lines with the unknown value x may have objectives. All the objectives shown in bold are necessary to set F=1, while the objectives at the input of OR gate 23 are not, since there are two alternative ways of setting clause E=1. Thus we say that an objective has high priority if it must be achieved, in the current state, to set F=1. The other objectives are said to have low priority. High- and low-priority objective will be abbreviated as HI- and LO-objectives, respectively. It should be noted that, as seen in the FIG. 4 circuit, HI-objectives always form continuous implication chains starting with the PO objective. These continuous implication chains are represented by bold dashed arrows in FIGS. 4 through 7.

Based on the above-described classification of objectives into HI- and LO-objectives, the following rules can be formulated for propagating objectives:

1. The PO is assigned a 1 HI-objective.
2. Whenever there is only one choice for the input objectives of a gate, the input objectives inherit the priority of the output objective.
3. Whenever there are several choices for the input objectives of a gate, the input objective gets low priority.
4. A HI-objective on a fanout branch of a stem overrides LO-objectives on other fanout branches of the same stem.

In the FIG. 4 example, the HI-1 objective on fanout branch B1 overrides LO-0 on fanout branch B2 and the HI-1 objective is transmitted to the stem B. HI-objectives reaching PIs denote implications and are mapped into value assignments for the corresponding variables in the next clock cycle. Since every clause always has a HI-1 objective, these objectives are generally fixed in the logic and not propagated from the PO, but will nonetheless be shown as propagated from the PO in FIGS. 4 through 7 for clarity of illustration.

Figure 5:
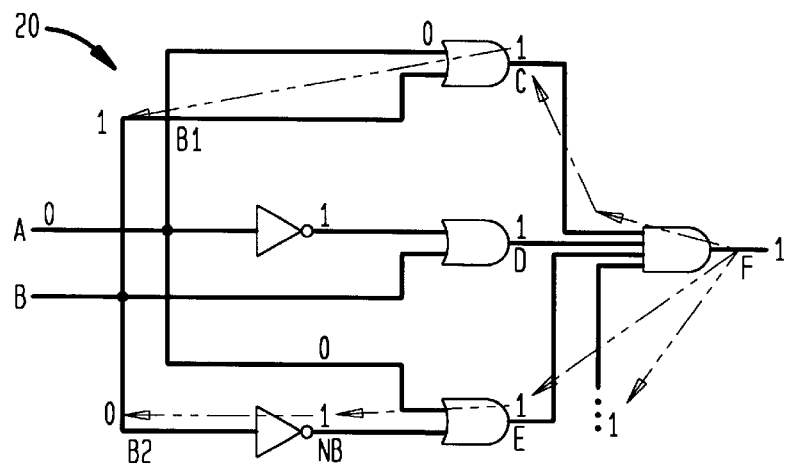

Detection of conflicting HI-objectives arriving at the same stem indicates an inconsistent state, because any binary value assigned to the stem in the current state would set the PO to 0 by reversing at least one of the implication chains arriving at the stem from the PO. FIG. 5 illustrates such a case where the objectives at fanout branches B1 and B2 are HI-1 and HI-0, respectively. In such a situation, the satisfier should backtrack immediately to eliminate useless effort in a no-solution area of the search space. This may be achieved using the above-described technique to map any HI-objective reaching a PI into its corresponding variable assignment, because no matter which binary value is assigned to that PI, one of the implication chains will be reversed and the result will be F=0. This value of F may therefore be used in the synchronization unit 32 to initiate backtracking. Detecting conflicts in this manner significantly speeds up the search process in the satisfier 30.

Figure 6:
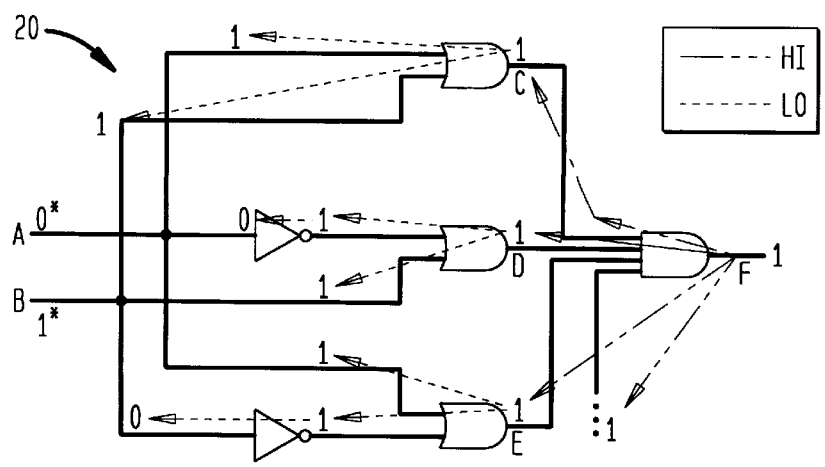

In accordance with the invention, an additional priority level may be used to differentiate among LO-objectives in the satisfier 30. Designating an objective as an LO-objective indicates that although the objective is useful to achieve an upstream HI-objective, in the current state there are other alternative ways of achieving the same HI-objective. In the example of FIG. 6, all of the OR gate inputs have LO-1 objectives, and both A and B receive two LO-1 objectives and one LO-0 objective from their fanout branches. Clearly, this indicates potential for future conflicts. The choice of the objective value to propagate to the stem in this case is arbitrary, e.g., A gets 0 and B gets 1, but the stem objectives may be flagged as a potential conflict by marking each of them with a "*". Such an objective will be referred to as a *-objective. It is generally advantageous to process a *-objective before an LO-objective, because the sooner a conflict is detected, the faster the backtracking, and hence the shorter the search. Thus, * can be viewed as an intermediate priority level between HI and LO. The variable logic 38 will select the next decision variable among the PIs with a potential conflict flag. Propagating LO-1 objectives from all inputs of the OR gates in circuit 20 guarantees that all potential conflicts are identified.

FIG. 7 shows an example illustrating dead literals and dynamically unate variables. As a result of assigning A=1 in FIG. 7, clause E becomes satisfied. Then the value of the other input of the corresponding OR gate becomes a "don't care" and this input is referred to as a "dead" literal. Although B is a binary variable, it may no longer cause a conflict in the current state, i.e., B has become a dynamically unate variable. To transmit the information about dead literals back to the variables generating the dead literals, a dead objective ø is introduced. Clearly, the priority of the objective ø should be the lowest of the priorities identified thus far. Then B in the FIG. 7 example is recognized as a dynamically unate variable because its fanout branches propagate only non-conflicting objectives, i.e., LO-1 and ø. Although the value of B is not implied by the current state, one can opportunistically assign B=1 to satisfy the clauses C and D in FIG. 7 without causing any conflicts. To effectively treat B=1 as an implication, the variable logic 38 will convert the non-conflicting LO-1 objectives into an HI-1 objective which will generate the implication B=1 in the next clock cycle. This process will continue since the newly satisfied clauses will create new dead literals, which in turn may cause other variables to become dynamically unate, and so on. In summary, the satisfier 30 in the above-described illustrative embodiment recognizes four priorities for objectives: HI, * (potential conflict), LO and ø (dead). These four priorities are encoded using two bits.

FIG. 8 shows the clause logic 34 of satisfier 30 in greater detail. In this embodiment, every clause with m literals is implemented by a corresponding bidirectional iterative logic array (ILA) structure 80-$i$, i=1, 2, ... N, which includes m OR2 cells 84-$j$, j=1, 2, ... m, and where N is the number of clauses in the CNF model. The cells used in these and other ILA structures described herein may be elements of a library of cells designed and parameterized for a target CNF. This ILA-based approach of the present invention is inherently scalable, since adding more cells to an ILA does not change its regular structure. A given OR2 cell 84-$j$, which is neither the right-most or left-most cell in the structure 80-$i$, e.g., OR2 cell 84-2 in ILA structure 80-1, receives the value of one variable ($V_{in}$), a flag (Inv) indicating whether $V_{in}$ should be inverted, and the partial OR result from the cells on its left ($V_l$), and computes $V_r=(V_{in} \oplus \text{Inv})+V_l$ for the next cell on its right, using three-valued logic. The $V_r$ value obtained at the right-most OR2 cell, e.g., cell 84-3 in ILA structure 80-1, is the clause output value, which is sent to a corresponding two-input AND ILA 82-*i* to iteratively compute the value of the function F.

While values propagate left-to-right through the ILAs 80-*i*, the computation of input objectives advances in the opposite direction. The OR2 cell 84-2 in ILA structure 80-1 receives its output objective $O_r$ from the cell on its right ($O_r$ is initialized to HI-1 at the right-most cell 84-3), and determines the objective for its input $O_{in}$ and the output objective $O_l$ for the cell to its left. In fact, the binary value of any non-dead objective is known a priori (1 for $O_l$ and $\overline{\text{Inv}}$ for $O_{in}$) and may be hard-coded in the logic. Thus only the computation of priorities is relevant in the OR2 cell of the clause logic 34. The FIG. 9 table illustrates the manner in which the objective priorities are computed in a given OR2 cell 80-*j*. In this table, H/L denotes a HI or LO priority and "-" indicates a "don't care" entry.

FIG. 10 shows the literal logic 36 in greater detail. A stem is modeled as a sequence of stems each with two fanout branches, as shown generally at 90. The stem objective is computed by an ILA structure which includes ST2 cells 100-*k*, k=1, 2, . . . , which iteratively merge the objectives arriving on fanout branches from the clause logic 34. A given ST2 cell, which is neither the right-most or left-most cell in the ILA structure, e.g., ST2 cell 100-2, receives the partial result $O_r$ from the cell on its right and the objective of one fanout branch $O_{br}$, and computes the objective for its stem $O_l$, which is sent to the next cell on its left. The $O_l$ output from the left-most cell, e.g., cell 100-1, is the PI objective sent to variable logic 38. The propagation of the variable values is straightforward and is not shown in FIG. 10. The rules for computing objectives in the ST2 cells are given in the table of FIG. 11, where v and a are arbitrary objective values, and H/L/*∈{HI, LO, *}. Note that $O_{br}$ cannot be a potential conflict (which may be generated only by literal logic 36), and that $O_{br}$ is given priority over $O_r$ in the case in which both have HI-priority. A conflict between HI-objectives will be detected in this embodiment because any value assigned to the stem will cause the clause logic 34 to output F=0.

FIG. 12 shows the variable logic 38 in greater detail. The variable logic 38 is implemented as a bidirectional ILA of VL cells 120-*p*, p=1, 2, . . . , with each cell corresponding to a variable. As will be described in greater detail below, the variable logic 38 implements a stack which is distributed across the VL cells. A given cell 102-*l* maintains its current value V in a 2-bit register, and receives the objective O from literal logic 36 as a 3-bit field, i.e., 2 bits for priority and 1 for value. A HI-objective indicates that the objective value must be assigned to this variable as an implication in the next clock cycle. All cells with HI-objectives are concurrently assigned. A LO-objective shows that this variable has become dynamically unate, and its priority is therefore immediately converted to HI so that it will be treated as an implication. A *-objective denotes a potential conflict. If no variable must be implied, one of the variables with a *-objective will be selected as the next decision variable. Finally, a dead objective denotes a variable that should do nothing.

Since all implications generally must be made before any decision is tried, the ILA structure in variable logic 38 iteratively determines whether HI-objectives are present anywhere in the structure. For this, a given cell computes a $HI_r$ flag signaling whether its objective O or any of the objectives of the cells to its left have HI-priority. The result from the preceding cells is brought in by the input $HI_l$. The signal Impl obtained at the $HI_r$ output from the right-most cell, e.g., cell 120-3, reports whether at least one variable is being implied. Since no decisions should be made while implications are in progress, Impl is complemented and fed back to the right-most cell as a decision-enable input $DE_r$. A cell receiving a dead objective (O=∅), because either its value is binary or because its variable is dead, just passes the decision enable signal through, i.e., $DE_l$=$DE_r$. A cell receiving only dead objectives identifies a dead variable, which will be ignored in all subsequent assignments. If the objective O of a cell denotes a potential conflict and the cell is enabled to take a decision, i.e., has $DE_r$=1, then its variable will be the next decision variable, so it disables decisions for the cells to its left by setting its $DE_l$ output to 0. The complement of the $DE_l$ from the left-most cell, e.g., cell 120-1, is the signal Decision which indicates whether any cell is taking a decision. Both Decision and Impl being 0 means that all arriving objectives are ∅, since any non-dead objective would produce either an implication or a decision. All objectives may be dead only when the function F has a binary value.

Each VL cell in the variable logic 38 may be implemented as a state machine with 4 states: 1) Unset (initial state with V=x), 2) Implied (V implied from a HI-objective), 3) Assigned (V assigned from a *-objective by a decision), and 4) Complemented (V is the result of reversing the last decision of this cell). Being in the Complemented state results in asserting the output $CT_r$. Only one VL cell in the ILA structure can be in this state at any given time, since only one decision variable is elected at that time. Thus one can OR the left input $CT_l$ with a flag indicating that the cell is in the Complemented state, to obtain the output $CT_r$. The signal Compl_tried obtained at the $CT_r$ output from the right-most cell reports whether the decision variable at the top of the stack has been complemented. Compl_tried, along with Decision and Impl, is sent to the synchronization unit 32 to report the status of the variable logic 38. State transitions in a VL cell are controlled by its arriving objective O, its decision enable input $DE_r$, and the 2-bit control input CIR which is received from the synchronization unit 32 and shared among all cells.

The variable logic 38 in the illustrative embodiment thus distributes the stack among the VL cells, in contrast to conventional approaches which utilize a central stack. The distributed stack for all of the variables may be viewed as a global stack for the satisfiability problem, with each variable utilizing a "slice" of the global stack. Each of the VL cells corresponds to one variable and maintains the slice of the global stack utilized by that variable. All of the stack slices are synchronized by the same control signals and have the same depth. In the illustrative embodiment, as the state of a cell is encoded in a 2-bit state register, every cell is allocated a 2-bit wide slice of the global stack, such that its state register is at the top of the stack. The width of the global stack depends on the number of variables and the number of bits used to encode the state for each variable. For example, if there are 100 variables, with the state of each variable encoded using 2 bits, the width of the global stack is 200 bits. All stack slices are concurrently pushed or popped as specified by the common CTR inputs. This type of distributed control mechanism is easily scalable. The stack slices may be implemented with bidirectional shift registers that map push and pop stack operations into shift right and shift left operations. The size of these registers determines the depth of the stack, which may be adjusted based on the size of the problem. A register size providing a default depth of about 20 is sufficient for a large number of problems, although other depths could also be used. If the synchronization unit 32 detects a stack overflow condition, the run is aborted and the variable logic 38 must be reconfigured using cells with a register size providing a deeper stack.

The synchronization unit 32 determines the state of the satisfier 30 using the signal F from the clause logic 34, the signals Impl, Decision and Compl_tried from the variable logic 38, and an up/down counter SP that keeps track of the stack position, which is the same for all of the stack slices. From these signals the synchronization unit 32 can tell if the problem has been satisfied (F=1), if the problem is unsatisfiable (SP=0 and there is still need to backtrack), or if execution should continue. In the latter case, different actions are issued in parallel to the 2-bit control input CTR of each VL cell. F=0 indicates the need to complement the current decision, or backtrack to the previous one, if Compl_tried is asserted for the current decision. If F=x, there may be a new decision, implications resulting from the previous decision, or the satisfier may be in between consecutive backtracks. The first two cases will cause new variable assignments, and the third case will require popping the stack again.

Another function of the synchronization unit 32 is to provide clocking signals to the rest of the satisfier circuitry. After new variables are set, the longest delay until Decision becomes stable involves two traversals through the variable logic ILA structure. This delay T can be determined from post-layout timing analysis, and may be programmed into the synchronization unit 32. A main clock frequency $f_1$ may be defined as 1/T, and a secondary, faster frequency $f_2$ may be used for consecutive pop operations of the stack. Note that no variable assignments are made between consecutive stack pops. Instead, the satisfier waits for the Comp_tried signal to propagate through the variable logic ILA structure. Usually, frequency $f_2$ is approximately twice frequency $f_1$.

The satisfier 30 provides new forms of parallelism that significantly reduce the amount of search required to solve the SAT problem. A parallel-backtrace satisfier in accordance with the invention can be as much as several orders of magnitude faster than a software SAT solver and also provides similar advantages relative to previous satisfiers implemented in reconfigurable hardware. Unlike previous satisfiers whose efficiency is limited by incorrect or unnecessary variable assignments, parallel-backtrace satisfiers in accordance with the invention can skip over variables whose assignment is unnecessary in the current state and select only the correct values for variables which become dynamically unate in the current state.

The above-described embodiments of the invention are intended to be illustrative only. For example, alternative embodiments may be configured which utilize different arrangements of logic circuitry to implement decision making, backtracing and other satisfier functions. The invention may also be implemented in part in software, e.g., in one or more software programs stored on a computer-readable medium, and in various combinations of hardware and software. These and numerous other alternative embodiments within the scope of the following claims will be apparent to those skilled in the art.

What is claimed is:

1. A method of determining assignments of primary inputs which produce a specified value at a primary output of a circuit to be analyzed for satisfiability, the method comprising the steps of:
representing at least a portion of the circuit in reconfigurable hardware; and
controlling the hardware so as to provide parallel backtracing of objectives along a plurality of circuit paths from the primary output toward the primary inputs.

2. The method of claim 1 further including the step of implementing clauses, literals and variables in the circuit in corresponding sets of clause logic, literal logic and variable logic, respectively, in the reconfigurable hardware.

3. The method of claim 1 further including the step of providing concurrent assignment of at least a subset of the primary inputs.

4. The method of claim 1 further including the steps of identifying at least one dynamically unate variable in a set of variables associated with the circuit, and assigning a value to the dynamically unate variable such that all clauses containing the variable become satisfied.

5. The method of claim 1 further including the steps of identifying at least one dead variable in a set of variables associated with the circuit, and avoiding assignments to the dead variable.

6. The method of claim 1 further including the step of processing the objectives in accordance with assigned priorities.

7. The method of claim 6 further including the steps of assigning a given objective a high priority if that objective must be achieved, in a current state, to set the primary output to a specified value, and otherwise assigning the given objective a low priority.

8. The method of claim 6 further including the step of automatically assigning the primary output a high priority.

9. The method of claim 6 further including the step of assigning the input objectives of a gate in the circuit the priority of its corresponding output objective if there is only one choice for a value for the input objectives of the gate.

10. The method of claim 6 further including the step of assigning the input objectives of a gate in the circuit a low priority if there are a plurality of choices for a value for the input objectives of the gate.

11. The method of claim 6 wherein if a fanout branch of a stem in the circuit has a high priority, its objective overrides the objectives of any low priority fanout branches on the same stem, and is assigned to the stem.

12. The method of claim 6 wherein if a conflict is detected between low priority objectives on different fanout branches of a stem in the circuit, a selected one of the low priority objectives is assigned to the stem, with an intermediate priority.

13. The method of claim 6 further including the steps of converting all low priority objectives for dynamically unate variables to high priority, assigning all variables with high priority objectives, and, when there are no high priority objectives, selecting and assigning a variable with an intermediate priority.

14. The method of claim 1 further including the step of complementing a previous variable assignment if the assignment results in the output taking on a value opposite to the specified value.

15. An apparatus for determining assignments for primary inputs which produce a specified value at a primary output of a circuit to be analyzed for satisfiability, the apparatus comprising:
a set of reconfigurable hardware for representing at least a portion of the circuit, wherein the hardware is controlled so as to provide parallel backtracing of objectives along a plurality of circuit paths from the primary output toward the primary inputs.

16. The apparatus of claim 15 wherein the reconfigurable hardware further includes clause logic, literal logic and variable logic for implementing logic functions associated with clauses, literals and variables, respectively, of the circuit.

17. The apparatus of claim 16 further including a synchronization unit which provides timing and control signals to the clause logic, literal logic and variable logic.

18. The apparatus of claim 16 wherein the at least one of the clause logic, the literal logic and the variable logic are implemented using an iterative logic array comprising a plurality of cells, each representative of a logic function associated with a corresponding clause, literal or variable.

19. The apparatus of claim 16 wherein the variable logic implements a stack which is distributed over a plurality of cells of an iterative logic array associated with the variables, with each of at least a subset of the cells having a register associated therewith defining a width of at least a portion of the stack.

20. An apparatus for determining assignments of primary inputs which produce a specified value at a primary output of a circuit to be analyzed for satisfiability, the apparatus comprising:

reconfigurable hardware means for representing at least a portion of the circuit; and means for controlling the hardware to provide parallel backtracing of objectives along a plurality of circuit paths from the primary output toward the primary inputs.

21. An apparatus for determining assignments for primary inputs which produce a specified value at a primary output of a circuit to be analyzed for satisfiability, the apparatus comprising:

clause logic, literal logic and variable logic for implementing logic functions associated with clauses, literals and variables, respectively, of the circuit; and a controller for directing the operation of the clause logic, literal logic and variable logic so as to provide parallel backtracing of objectives along a plurality of circuit paths from the primary output toward the primary inputs.

22. The apparatus of claim 21 wherein at least a portion of the clause logic, literal logic and variable logic are implemented in reconfigurable hardware.

23. The apparatus of claim 21 wherein the controller comprises a synchronization unit which provides timing and control signals to the clause logic, literal logic and variable logic.

24. The apparatus of claim 21 wherein at least one of the clause logic, the literal logic and the variable logic are implemented using an iterative logic array comprising a plurality of cells, each representative of a logic function associated with a corresponding clause, literal or variable.

25. The apparatus of claim 21 wherein the variable logic implements a stack which is distributed over a plurality of cells of an iterative logic array associated with the variables, with each of at least a subset of the cells having a register associated therewith defining a width of at least a portion of the stack.

26. A method of determining assignments of primary inputs which produce a specified value at a primary output in a satisfiability problem, the method comprising the steps of:

representing at least a portion of the satisfiability problem using a formula in conjunctive normal form; and implementing at least a portion of the conjunctive normal form representation in reconfigurable hardware, wherein the hardware is controlled so as to provide parallel backtracing of objectives along a plurality of paths from the primary output toward the primary inputs.

27. An apparatus for determining assignments for primary inputs which produce a specified value at a primary output in a satisfiability problem, the apparatus comprising:

a set of reconfigurable hardware for implementing a conjunctive normal form representation of at least a portion of the satisfiability problem, wherein the hardware is controlled so as to provide parallel backtracing of objectives along a plurality of paths from the primary output toward the primary inputs.

\* \* \* \* \*